US012080640B2

(12) United States Patent
Li et al.

(10) Patent No.: US 12,080,640 B2
(45) Date of Patent: Sep. 3, 2024

(54) SELF-ALIGNED VIA TO METAL LINE FOR INTERCONNECT

(71) Applicant: International Business Machines Corporation, Armonk, NY (US)

(72) Inventors: Tao Li, Slingerlands, NY (US); Ruilong Xie, Niskayuna, NY (US); Tsung-Sheng Kang, Ballston Lake, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 17/475,995

(22) Filed: Sep. 15, 2021

(65) Prior Publication Data

US 2023/0077878 A1    Mar. 16, 2023

(51) Int. Cl.
  *H01L 23/522*  (2006.01)
  *H01L 21/768*  (2006.01)
  *H01L 23/532*  (2006.01)

(52) U.S. Cl.
  CPC .... *H01L 23/5226* (2013.01); *H01L 21/76885* (2013.01); *H01L 21/76892* (2013.01); *H01L 23/53257* (2013.01); *H01L 23/5329* (2013.01)

(58) Field of Classification Search
  CPC .......... H01L 23/5226; H01L 21/76885; H01L 21/76892; H01L 23/53257; H01L 23/5329; H01L 23/5283; H01L 21/76897
  See application file for complete search history.

(56) References Cited

U.S. PATENT DOCUMENTS

| 5,928,967 | A | 7/1999 | Radens et al. |
| 9,299,583 | B1 | 3/2016 | Wang et al. |
| 9,349,691 | B2 * | 5/2016 | Murray ............ H01L 23/53295 |
| 9,679,805 | B2 | 6/2017 | Bouche et al. |
| 9,793,164 | B2 | 10/2017 | Machkaoutsan et al. |
| 9,812,351 | B1 | 11/2017 | Licausi et al. |
| 9,953,834 | B1 | 4/2018 | Sun et al. |
| 10,002,222 | B2 | 6/2018 | Cline et al. |
| 10,049,920 | B1 | 8/2018 | Anderson et al. |
| 10,079,173 | B2 | 9/2018 | Xie et al. |
| 10,396,026 | B2 | 8/2019 | Wei et al. |
| 11,244,861 | B2 * | 2/2022 | Xie ..................... H01L 23/5223 |
| 2018/0269306 | A1 | 9/2018 | Bao et al. |
| 2021/0125865 | A1 | 4/2021 | Dutta et al. |

OTHER PUBLICATIONS

Wang et al., "Atomic level control of pattern fidelity during SAC etch," Proceedings vol. 11615, Advanced Etch Technology and Process Integration for Nanopatterning X (Feb. 2021) (7 pages).
Vos et al., "Area-Selective Deposition of Ruthenium by Combining Atomic Layer Deposition and Selective Etching," Chem. Mater. 31, pp. 3878-3882 (May 2019).

* cited by examiner

*Primary Examiner* — Allison Bernstein
(74) *Attorney, Agent, or Firm* — Daniel J Blabolil

(57) ABSTRACT

Interconnect structures having top vias self-aligned to metal line ends and techniques for formation thereof are provided. In one aspect, an interconnect structure includes: at least one metal line disposed on a substrate; at least one top via over the at least one metal line, wherein the at least one top via is aligned with an end of the at least one metal line, and wherein a sidewall of the at least one top via is curved. A dielectric fill material can be disposed adjacent to the at least one top via having sidewalls that are also curved. A method of fabricating an interconnect structure is also provided.

19 Claims, 20 Drawing Sheets

SELF-ALIGNED VIA TO METAL LINE FOR INTERCONNECT

FIELD OF THE INVENTION

The present invention relates to interconnect structures, and more particularly, to interconnect structures having top vias self-aligned to metal line ends and techniques for formation thereof using metal fill or selective metal growth.

BACKGROUND OF THE INVENTION

Interconnect designs often use structures such as metal lines and/or vias to form intra- and inter-level connections between electronic devices or other components of an integrated circuit. For instance, some applications require the formation of a via over a metal line, also referred to herein as a 'top via.' There are, however, some notable challenges associated with top via designs, especially when the via is being formed over the end of the metal line.

Namely, conventional approaches typically use subtractive patterning to form the via over the metal line. However, this process can cause rounding at the ends of the metal line. In that case, a via formed at the line ends will have a smaller/reduced size due to the rounded metal line profile which undesirably leads to a higher interconnect resistance.

To accommodate for the rounded metal line profile, the location of the via can be moved in from the ends of the metal line. Doing so, however, limits the amount by which the distance between the vias over adjacent metal lines can be scaled.

Therefore, improved techniques for forming top vias over the ends of metal lines would be desirable.

SUMMARY OF THE INVENTION

The present invention provides interconnect structures having top vias self-aligned to metal line ends and techniques for formation thereof using metal fill or selective metal growth. In one aspect of the invention, an interconnect structure is provided. The interconnect structure includes: at least one metal line disposed on a substrate; at least one top via over the at least one metal line, wherein the at least one top via is aligned with an end of the at least one metal line, and wherein a sidewall of the at least one top via is curved.

In another aspect of the invention, another interconnect structure is provided. The interconnect structure includes: metal lines disposed on a substrate; a dielectric fill material in between ends of the metal lines; and top vias on the metal lines adjacent to the dielectric fill material, wherein the top vias are aligned with the ends of the metal lines, and wherein sidewalls of the top vias adjacent to the dielectric fill material are curved.

In yet another aspect of the invention, a method of fabricating an interconnect structure is provided. The method includes: forming metal lines on a substrate; patterning a cut in at least one of the metal lines; depositing a dielectric fill material into the cut; trimming the dielectric fill material to form a trimmed dielectric fill material with sidewalls that are curved; and forming top vias on the metal lines adjacent to the trimmed dielectric fill material, wherein the top vias are aligned with ends of the metal lines at the cut, and wherein sidewalls of the top vias adjacent to the trimmed dielectric fill material are also curved.

A more complete understanding of the present invention, as well as further features and advantages of the present invention, will be obtained by reference to the following detailed description and drawings.

DETAILED DESCRIPTION OF PREFERRED EMBODIMENTS

As highlighted above, there are certain drawbacks associated with conventional subtractive patterning approaches for forming top via interconnect structures, such as rounding at the end of a metal line. With these approaches, the via is set in from the end of the metal line in order to avoid an increased resistance/reduced via size due to the rounding. However, offsetting the via from the end of the metal line limits the scaling capacity of the design.

Provided herein are techniques for forming interconnect structures having top vias that are self-aligned to ends of an underlying metal line, which desirably enhances the scalability of the design. Advantageously, the present techniques employ a metal fill or selective metal growth process to form the top vias rather than a subtractive patterning approach. Thus, the problems associated with increased resistance/reduced via size due to rounding are avoided altogether.

Figure 1:
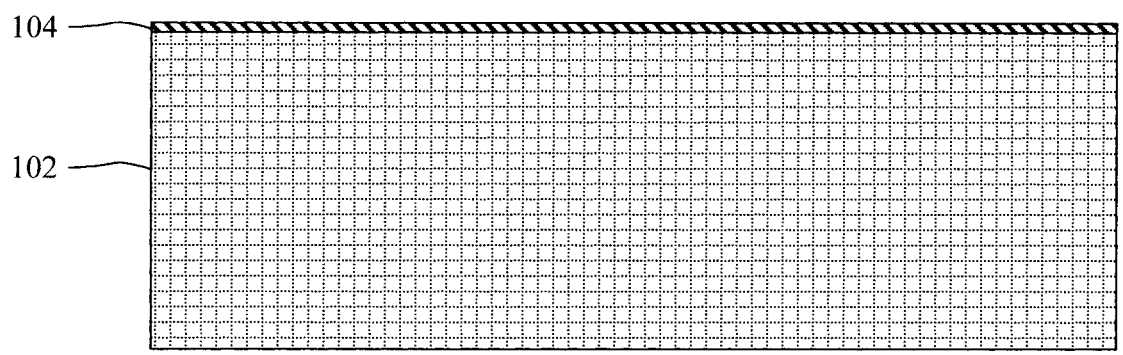
FIG. 1 is a cross-sectional diagram (from view A-A') illustrating a liner having been formed on a substrate according to an embodiment of the present invention.
Figure 2:
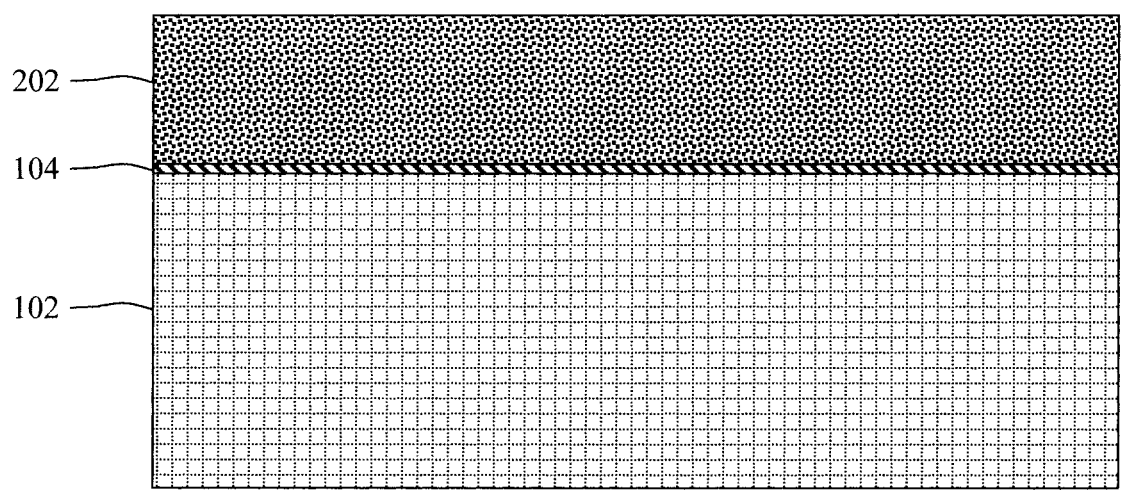
FIG. 2 is a cross-sectional diagram (from view A-A') illustrating a metal layer having been formed on the substrate over the liner according to an embodiment of the present invention.
Figure 3:
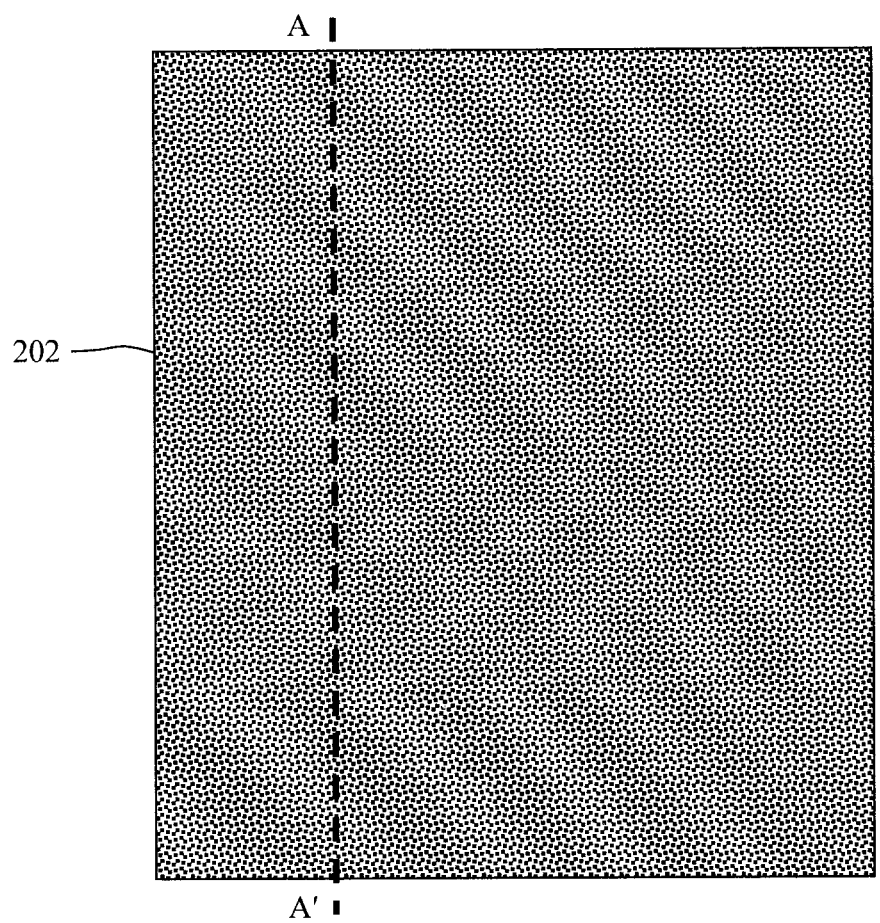
FIG. 3 is a top-down diagram illustrating an orientation of the cross-sectional views shown throughout the figures according to an embodiment of the present invention.
Figure 4:
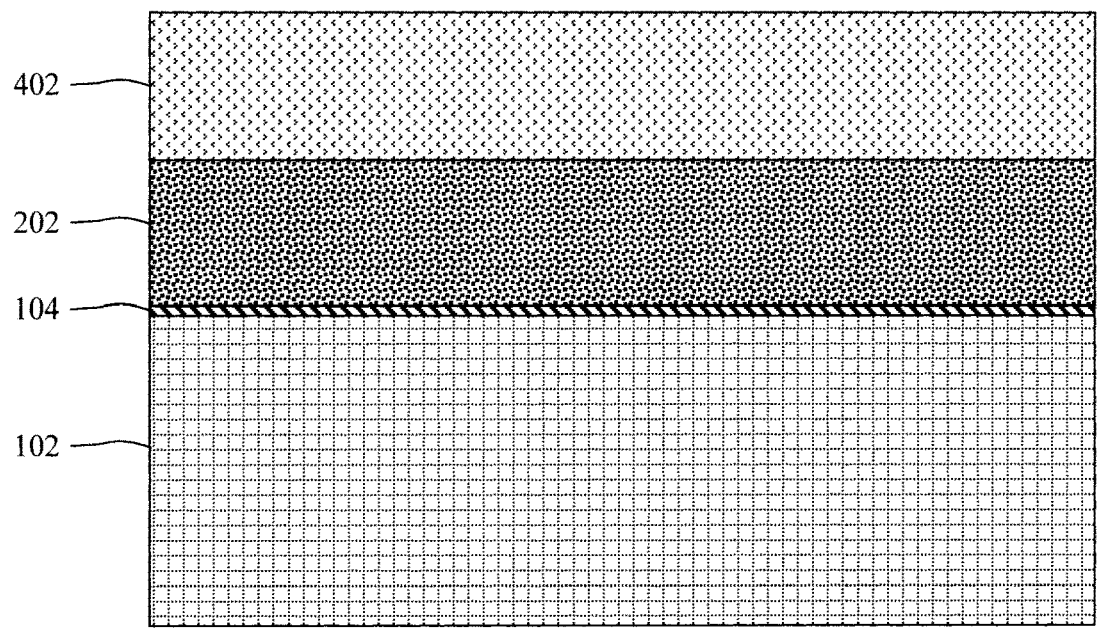
FIG. 4 is a cross-sectional diagram (from view A-A') illustrating a hardmask layer having been formed on the metal layer according to an embodiment of the present invention.

An exemplary methodology for fabricating an interconnect structure in accordance with the present techniques is now described by way of reference to FIGS. 1-23. As shown in FIG. 1 (a cross-sectional view A-A'), the process begins with the formation of a liner 104 on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 102 may already have pre-built structures (not shown) such as transistors, diodes, capacitors, resistors, interconnects, wiring, etc.

Liner 104 helps to prevent diffusion of the metal(s) from the overlying metal line (see below) into the substrate 102. Suitable materials for liner 104 include, but are not limited to, titanium nitride (TiN) and/or tantalum nitride (TaN) which can be deposited onto the substrate 102 using a process such as chemical vapor deposition (CVD), atomic layer deposition (ALD) or physical vapor deposition (PVD). According to an exemplary embodiment, liner 104 is formed having a thickness of from about 1 nanometer (nm) to about 3 nm and ranges therebetween.

A metal layer 202 is then formed on the substrate 102 over the liner 104. See FIG. 2 (a cross-sectional view A-A'). Suitable metals for metal layer 202 include, but are not limited to ruthenium (Ru), cobalt (Co) and/or tungsten (W) which can be deposited onto the substrate using a process such as CVD, ALD, evaporation, sputtering or electrochemical plating. According to an exemplary embodiment, metal layer 202 is formed having a thickness of from about 15 nm to about 30 nm and ranges therebetween. As will be described in detail below, the metal layer 202 will be patterned into multiple metal lines on the substrate 102. However, unlike conventional approaches, top vias to the metal lines (including at the line ends) will be formed using a unique metal fill or selective metal growth-based process rather than by subtractive patterning.

Cross-sectional and/or top-down views of the present structure will be used herein to illustrate the various steps of the fabrication process. For instance, the A-A' cut depicted in FIG. 3 (a top-down view) illustrates the orientation of the cross-sectional view shown in FIG. 2 and throughout the other figures. At this stage in the process, only the metal layer 202 is visible in the top-down view of FIG. 3.

Figure 5:
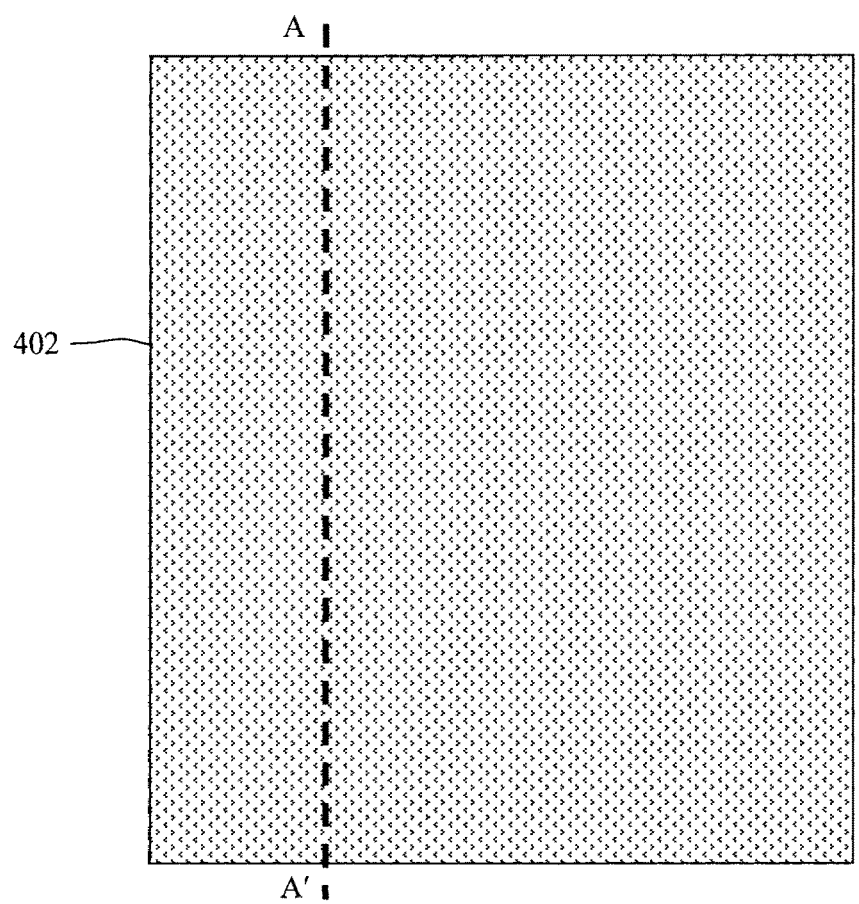
FIG. 5 is a top-down diagram illustrating the hardmask layer disposed over the metal layer according to an embodiment of the present invention.
Figure 6:
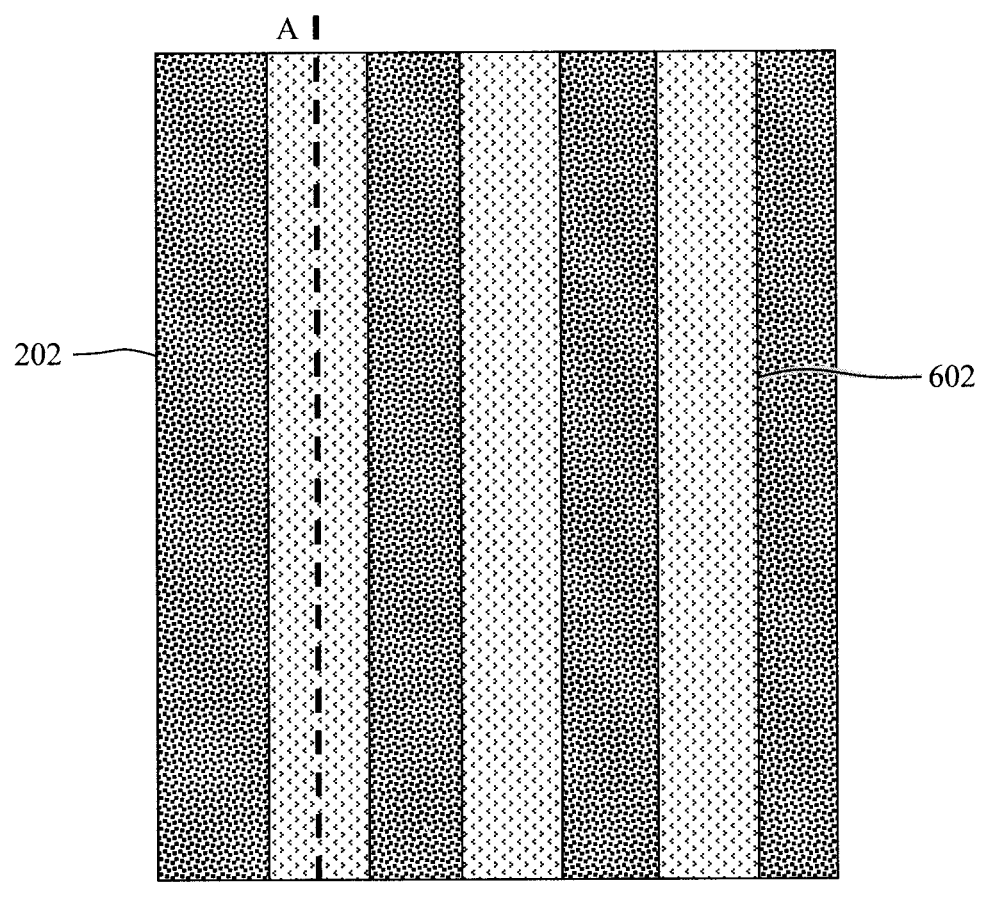
FIG. 6 is a top-down diagram illustrating the hardmask layer having been patterned with the footprint and location of metal lines, forming a patterned hardmask over the metal layer according to an embodiment of the present invention.
Figure 7:
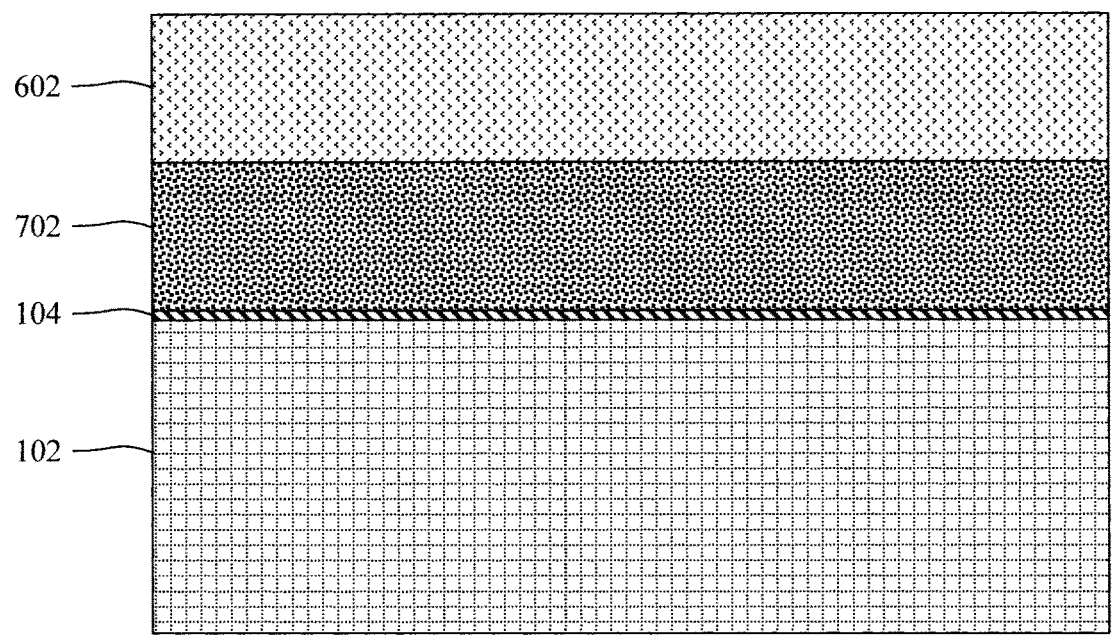
FIG. 7 is a cross-sectional diagram (from view A-A') illustrating the patterned hardmask having been used to pattern the metal layer into the metal lines according to an embodiment of the present invention.

A hardmask layer 402 is next formed on the metal layer 202. See FIG. 4 (a cross-sectional view A-A'). Suitable materials for hardmask layer 402 include, but are not limited to, oxide materials such as silicon oxide (SiOx) and/or nitride materials such as silicon nitride (SiN), silicon oxynitride (SiON) and/or silicon carbide nitride (SiCN) which can be deposited onto the metal layer 202 using a process such as CVD, ALD or PVD. FIG. 5 provides a top-down view of the structure. At this stage in the process, only the hardmask layer 402 is visible in the top-down view of FIG. 5.

Standard lithography and etching techniques are then employed to pattern the hardmask layer 402 with the footprint and location of the metal lines, forming a patterned hardmask 602 over the metal layer 202. See FIG. 6 (a top-down view). With standard lithography and etching techniques, a lithographic stack (not shown), e.g., photoresist/organic planarizing layer (OPL)/anti-reflective coating (ARC), is used to pattern the hardmask layer 402 with the footprint and location of the features to be patterned (in this case the metal lines). Alternatively, the patterned hardmask 602 can be formed by other suitable techniques, including but not limited to, sidewall image transfer (SIT), self-aligned double patterning (SADP), self-aligned quadruple patterning (SAQP), and other self-aligned multiple patterning (SAMP). For example, with SIT a direct patterning process is used to form mandrels (not shown) over the layer to be patterned (in this case hardmask layer 402). Spacers (shown) are then placed on opposite sides of the mandrels. The mandrels are removed, and the spacers are used as a patterning mask. Thus, SIT is a pitch doubling process since two spacers are placed for every mandrel formed. Advantageously, pitch multiplying processes such as these can be used to extend patterning capabilities to a granularity beyond that which can be achieved by direct patterning alone.

Figure 8:
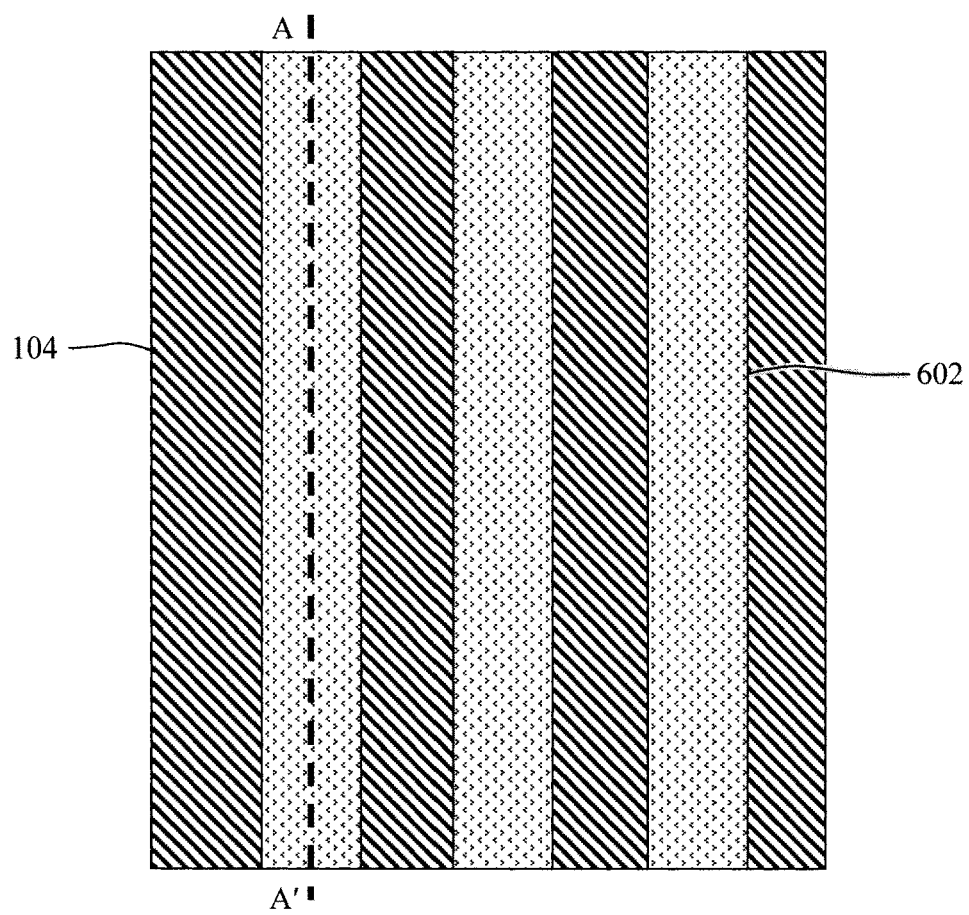
FIG. 8 is a top-down diagram illustrating the patterned hardmask over the metal lines and the underlying liner according to an embodiment of the present invention.
Figure 9:
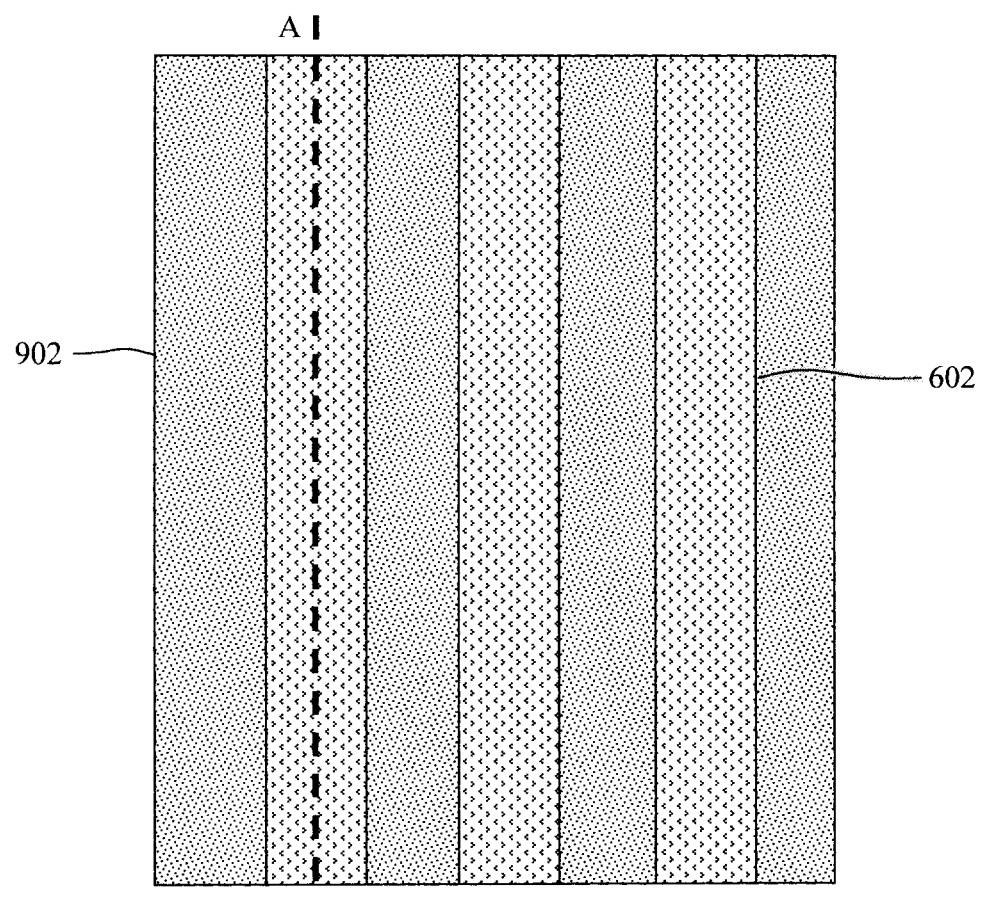
FIG. 9 is a top-down diagram illustrating an interlayer dielectric (ILD) having been deposited in between the patterned hardmask and metal lines according to an embodiment of the present invention.
Figure 10:
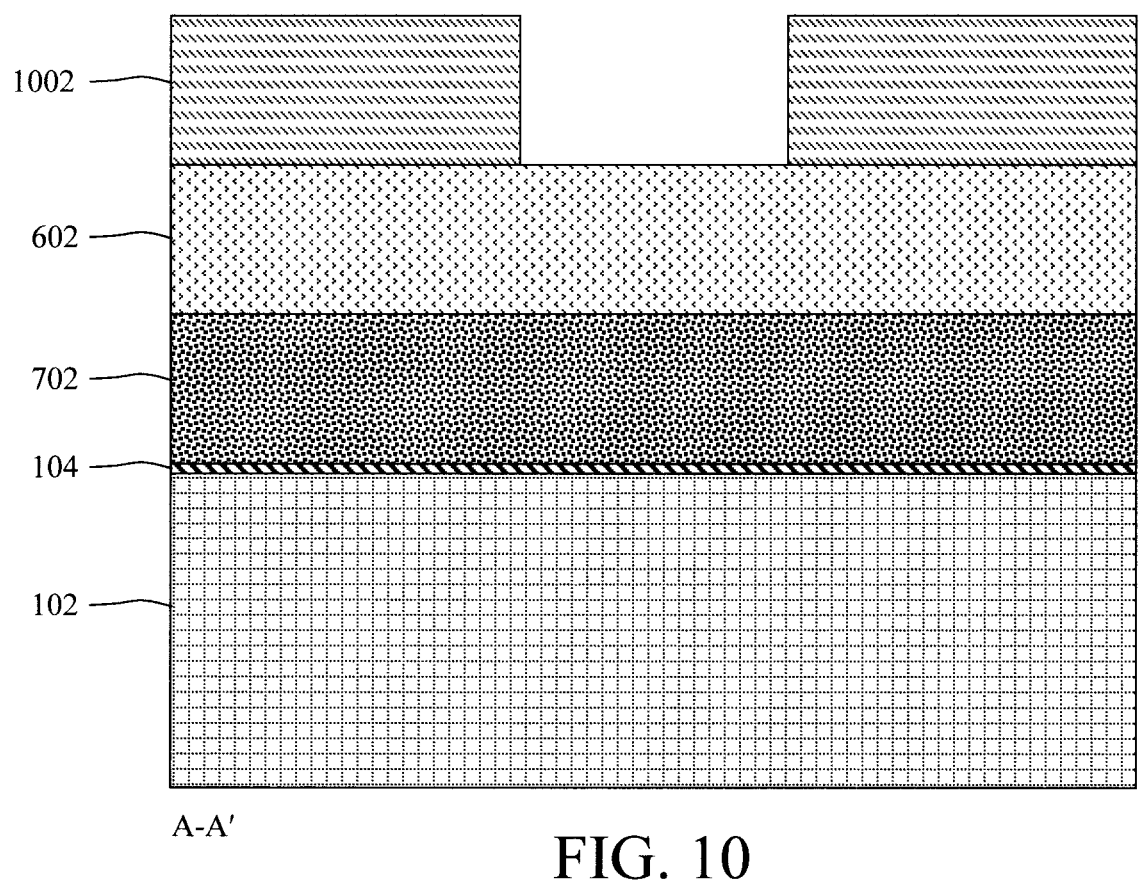
FIG. 10 is a cross-sectional diagram (from view A-A') illustrating a (first) block mask having been formed over the patterned hardmask marking the location of cuts to be made in the metal lines according to an embodiment of the present invention.

An etch is then used to transfer the pattern from the patterned hardmask 602 to the underlying metal layer 202, forming metal lines 702. See FIG. 7 (a cross-sectional view A-A'). A directional (anisotropic) etching process such as reactive ion etching (RIE) can be employed for the metal line etch. According to an exemplary embodiment, liner 104 serves as an etch stop for the metal line etch. At this stage in the process, the patterned hardmask 602 (which remains present over the metal lines 702) is visible in the top-down view shown in FIG. 8. As shown in FIG. 8, the etch of the metal lines 702 stops on the liner 104. Thus, liner 104 is also visible in the top-down view shown in FIG. 8.

Following patterning of the metal lines 702, an interlayer dielectric (ILD) 902 is deposited in between the patterned hardmask 602 and metal lines 702. See FIG. 9 (a top-down view). Suitable materials for ILD 902 include, but are not limited to, oxide materials such as SiOx and/or organosilicate glass (SiCOH) and/or ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as CVD, ALD, or PVD can be used to deposit the ILD 902. Following deposition, the ILD 902 can be polished down to the surface of the patterned hardmask 602 using a process such as chemical-mechanical polishing (CMP). According to an exemplary embodiment, a top surface of the ILD 902 is coplanar with a top surface of the patterned hardmask 602.

A cut is then formed in at least one of the metal lines 702. The present techniques will then be employed to form vias that are self-aligned to the ends of the metal line on either side of the cut. The first task is to pattern the patterned hardmask 602 with the footprint and location of the cut. To do so, a block mask 1002 is first formed over the patterned hardmask 602 marking the location of the cut(s). See FIG. 10 (a cross-sectional view A-A'). According to an exemplary embodiment, the block mask 1002 is formed from an OPL material which can be deposited onto the patterned hardmask 602 using a casting process such as spin-coating or spray casting. Standard lithography and etching techniques (see above) are then used to pattern the OPL to form the block mask 1002 shown in FIG. 10.

Figure 11:
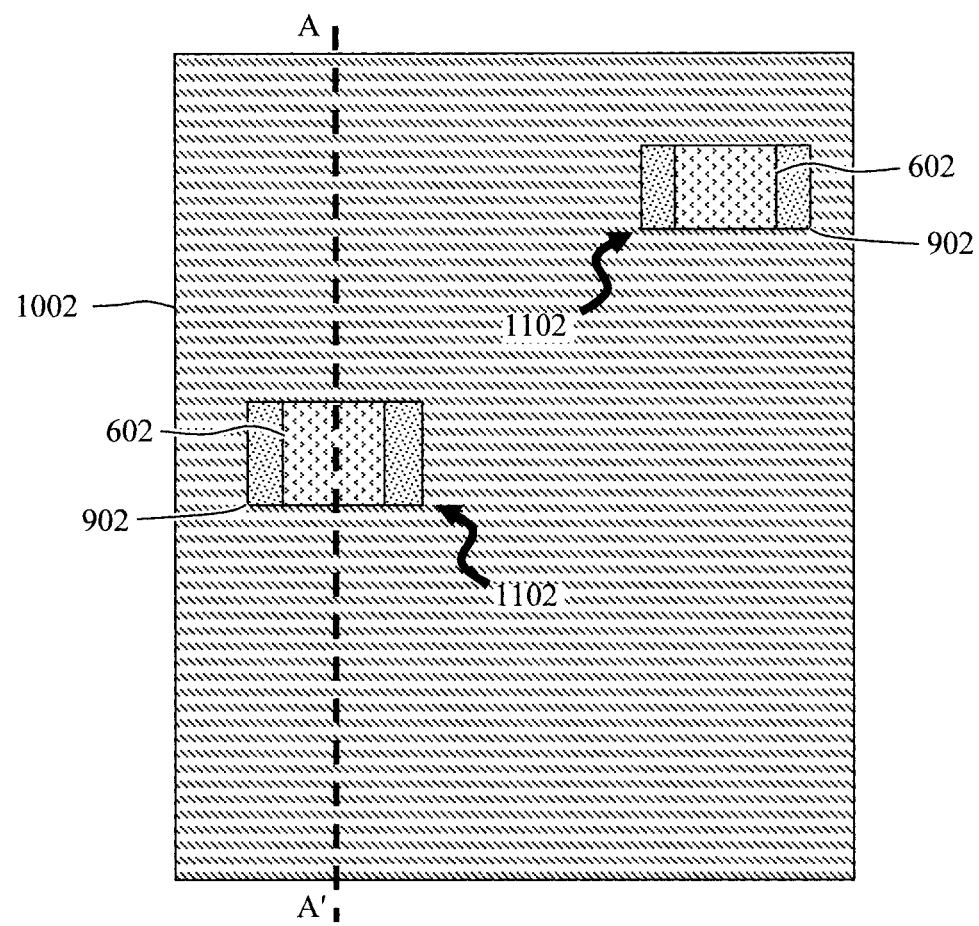
FIG. 11 is a top-down diagram illustrating the first block mask having been formed over the patterned hardmask marking the location of the cuts according to an embodiment of the present invention.

Referring to the top-down view shown in FIG. 11, it can be seen that the block mask 1002 will be used to cut the patterned hardmask 602 at multiple locations, in this case over two different metal lines 702. It is to be understood, however, that this is merely an example provided to illustrate the present techniques, and that more (or fewer) cuts in the patterned hardmask 602 than shown can be made, including the case where only a single cut in the patterned hardmask 602/metal line 702 is performed. As also shown in FIG. 11, openings 1102 in the block mask 1002 expose a region of the underlying patterned hardmask 602 to be cut, but can also extend over a portion of the adjacent ILD 902. This exposure of the ILD 902 is inconsequential, as long as the openings 1102 in the block mask 1002 do not inadvertently extend to the patterned hardmask 602 over the adjacent metal line 702.

An etch is then used to transfer the (line cut) pattern from the block mask 1002 to the underlying patterned hardmask 602 which, as patterned with the line cut, is now given the reference numeral 602'. See FIG. 12 (a cross-sectional view A-A'). The pattern from the patterned hardmask 602' is then transferred to the underlying metal line(s) 702 and liner 104 to form at least one cut 1202 in the metal line(s) 702/liner 104. A directional (anisotropic) etching process such as RIE can be employed (e.g., as a series of RIE steps) to form the cut(s) 1202 in the patterned hardmask 602', metal line(s) 702 and liner 104.

As provided above, the patterned hardmask 602 can be formed from a nitride material such as SiN, SiON and/or SiCN. In that case, a nitride-selective RIE can be employed to form the at least one cut 1202 in the patterned hardmask 602'. That way, even if a portion of the ILD 902 is exposed within the openings 1102 in the block mask 1002, only the patterned hardmask 602' will be etched. The ILD 902 will remain separating the portions of the patterned hardmask 602' to be cut from those that will not be cut.

Figure 12:
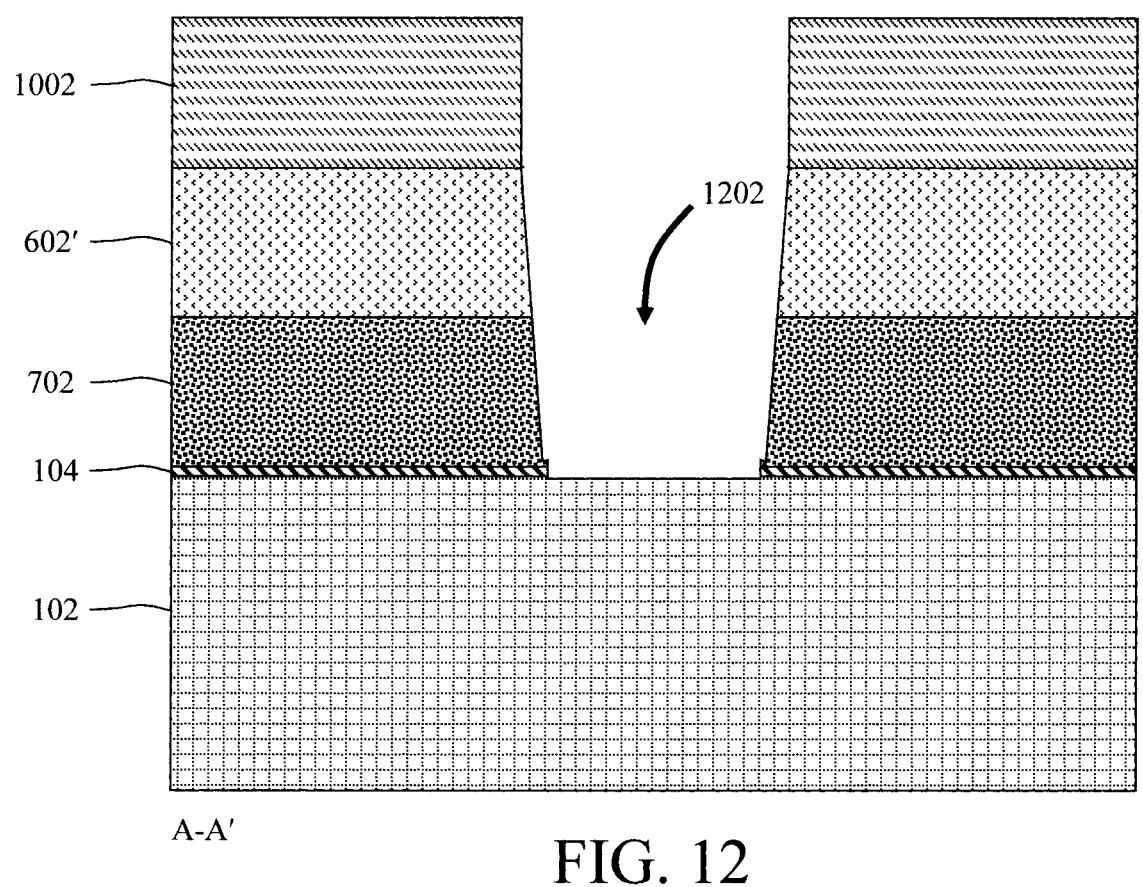
FIG. 12 is a cross-sectional diagram (from view A-A') illustrating the (line cut) pattern having been transferred from the first block mask to the patterned hardmask and the underlying metal lines and liner to form the cuts in the metal lines/liner according to an embodiment of the present invention.

As shown in FIG. 12, each cut 1202 has downward sloping sidewalls as it extends through the patterned hardmask 602', metal line 702 and liner 104. As will be described in detail below, a dielectric fill material will be deposited into the cut(s) 1202 between the ends of the (now cut) metal line(s) 702 that will separate the top vias. However, prior to forming the top vias (e.g., using metal fill or selective metal growth) a lateral etch will be employed to trim the dielectric fill material. Trimming the dielectric fill material enlarges the cavities in which the top vias are formed. As provided above, increasing the size of the top vias advantageously reduces the interconnect resistance.

Figure 13:
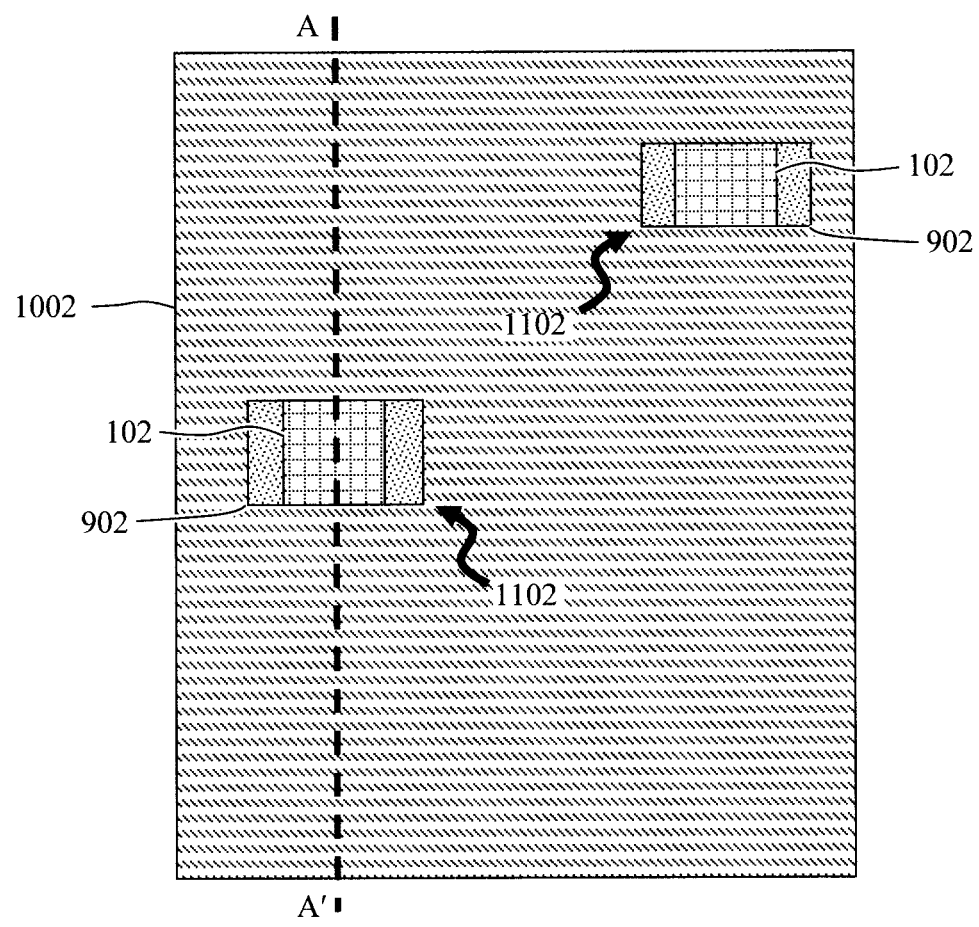
FIG. 13 is a top-down diagram illustrating the (line cut) pattern having been transferred from the first block mask to the patterned hardmask and the underlying metal lines and liner to form the cuts in the metal lines/liner according to an embodiment of the present invention.

As noted above, for illustrative purposes only the present example involves forming cuts 1202 in more than one of the metal lines 702. See FIG. 13 (a top-down view). As shown in FIG. 13, the (line cut) pattern from the block mask 1002 has been transferred to the underlying layers. From this top-down view, what is now visible is the substrate 102 present at the bottom of the cuts 1202. The ILD 902 remains separating adjacent metal lines.

Figure 14:
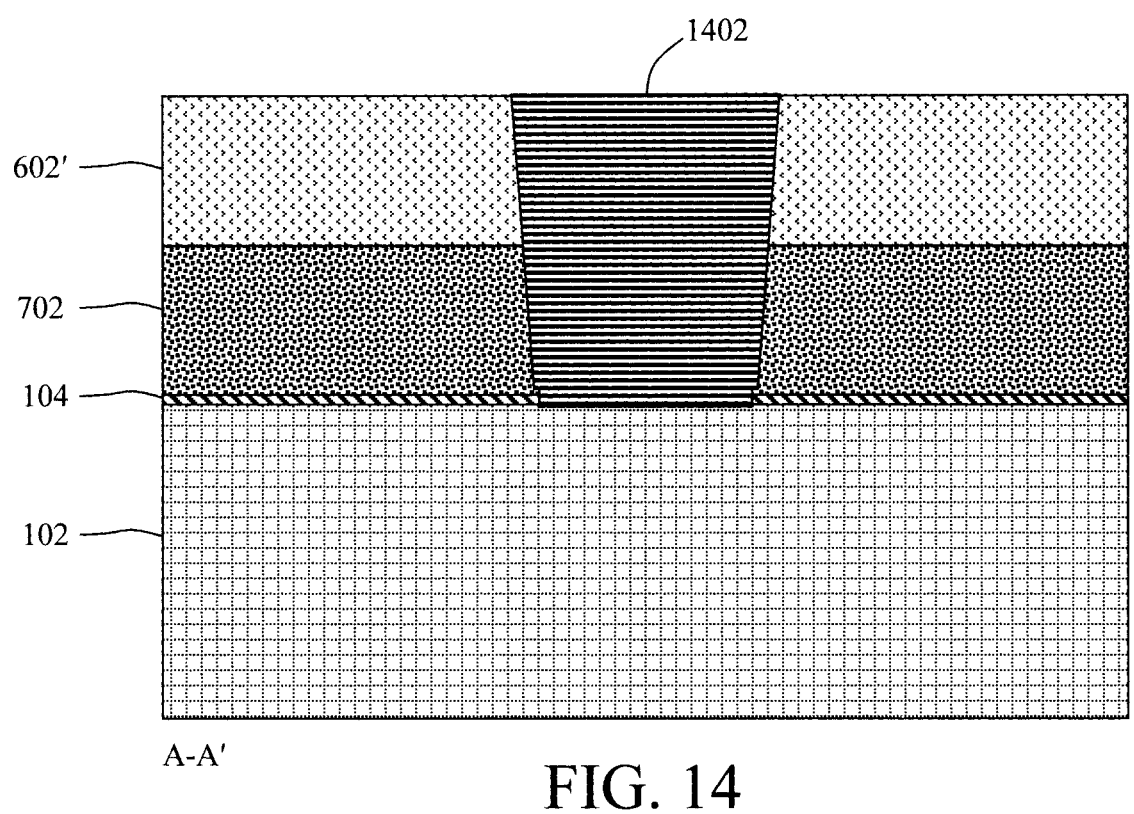
FIG. 14 is a cross-sectional diagram (from view A-A') illustrating the first block mask having been removed and a dielectric fill material having been deposited into, and filling, the cuts according to an embodiment of the present invention.

Following patterning of the cut(s) 1202 in the metal line(s) 702, the block mask 1002 is then removed. As provided above, the block mask 1002 can be formed from an OPL material. In that case, the block mask 1002 can be removed using a process such as ashing. A dielectric fill material 1402 is then deposited into, and filling, the cut(s) 1202. See FIG. 14 (a cross-sectional view A-A'). Suitable dielectric fill materials include, but are not limited to, aluminum oxide (AlOx), aluminum nitride (AlNx), titanium oxide (TiO), tantalum oxide (TaO), silicon carbide (SiC), silicon oxycarbide (SiCO) and/or silicon nitride (SiN) which can be deposited using a process such as CVD, ALD or PVD. Following deposition, the dielectric fill material 1402 can be polished using a process such as CMP. Thus, at this stage of the process, the top surface of the patterned hardmask 602' is coplanar with the top surface of the dielectric fill material 1402 as is shown in FIG. 14.

Figure 15:
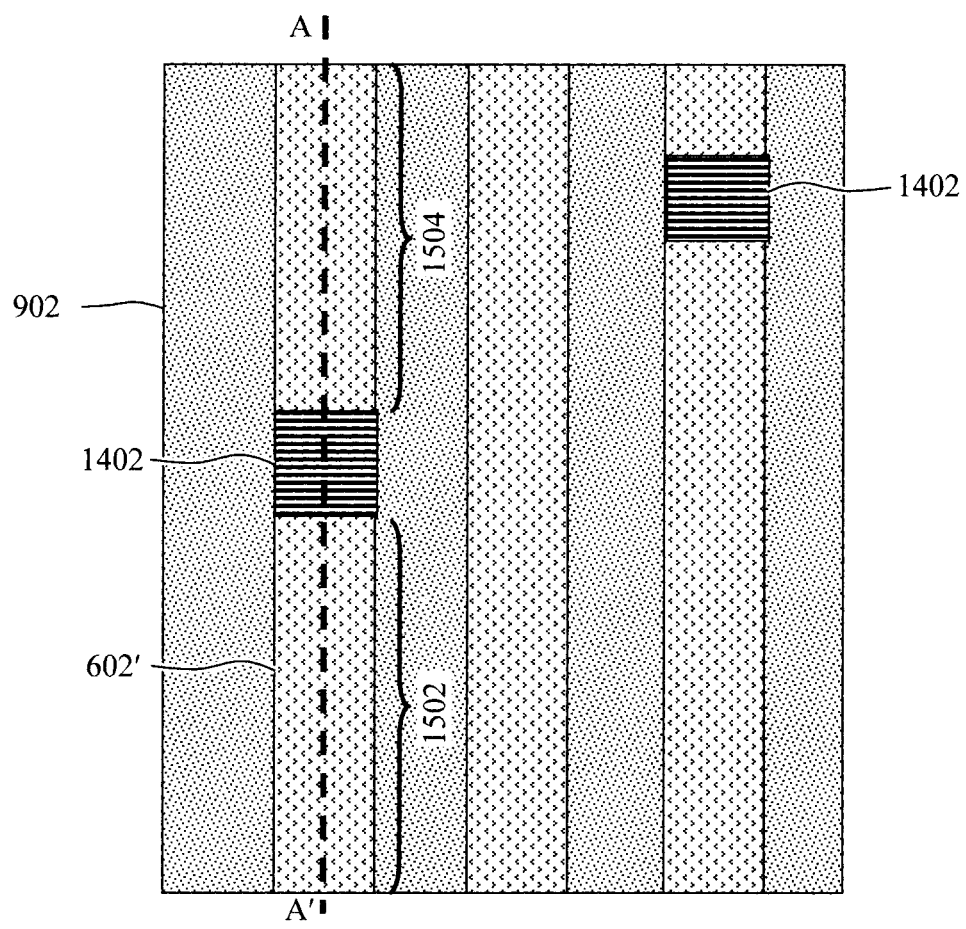
FIG. 15 is a top-down diagram illustrating the first block mask having been removed and the dielectric fill material having been deposited into, and filling, the cuts according to an embodiment of the present invention.

Referring to FIG. 15 (a top-down view) it can be seen that at least one of the metal lines 702 (underlying the patterned hardmask 602' visible in this view) has now been cut into at least two portions, e.g., a first portion 1502 and a second portion 1504. The dielectric fill material 1402 is disposed in between the first portion 1502 and the second portion 1504. As will be described in detail below, the dielectric fill material 1402 will also separate the top vias that will be formed over the ends of these first/second portions 1502/1504 of the metal line(s) 702.

The next task is to pattern the patterned hardmask 602' with the footprint and location of the top vias. To do so, a block mask 1602 is first formed over the patterned hardmask 602' marking the locations of the top vias. See FIG. 16 (a cross-sectional view A-A'). For clarity, the terms 'first' and 'second' may also be used herein when referring to block mask 1002 and block mask 1602, respectively. According to an exemplary embodiment, the block mask 1602 is formed from an OPL material which can be deposited onto the patterned hardmask 602' using a casting process such as spin-coating or spray casting. Standard lithography and etching techniques (see above) are then used to pattern the OPL to form the block mask 1602 shown in FIG. 16.

Figure 16:
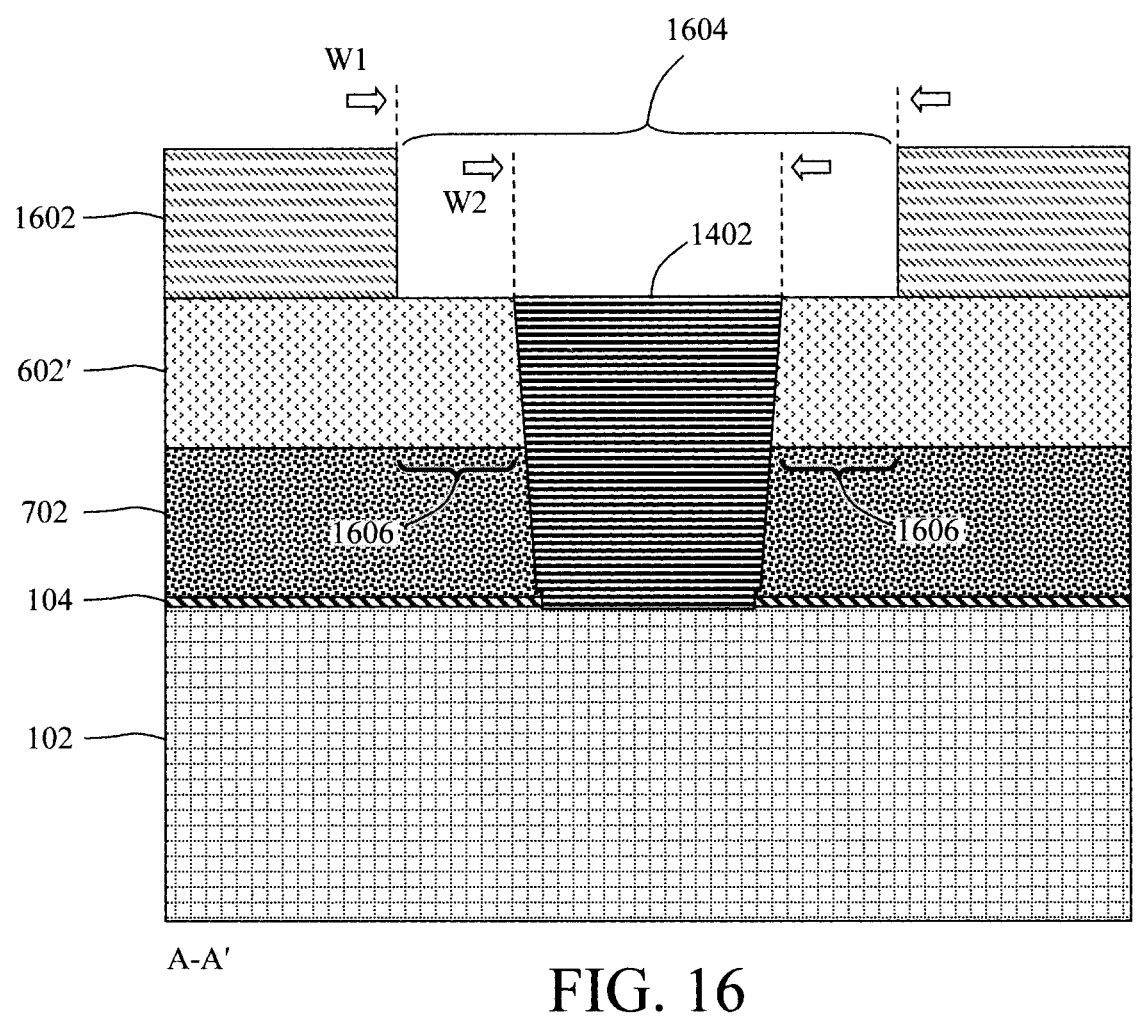
FIG. 16 is a cross-sectional diagram (from view A-A') illustrating a (second) block mask having been formed over the patterned hardmask with openings marking the locations of top vias according to an embodiment of the present invention.

As shown in FIG. 16, an opening(s) 1604 in the block mask 1602 over the ends 1606 of the metal line(s) 702 exposes portions of the patterned hardmask 602' to either side of the dielectric fill material 1402. Namely, a width W1 of the opening(s) 1604 in the block mask 1602 is greater than a width W2 at the top of the dielectric fill material 1402, i.e., W1>W2. This configuration will enable opening of the patterned hardmask 602' adjacent to the dielectric fill material 1402 to form cavities over ends 1606 of the (cut) metal line(s) 702 in which the top vias will be formed.

For illustrative purposes only, in the present example, top vias will also be formed over one or more of the metal lines 702 away from the ends of those metal lines 702. In that case, the present techniques are being employed herein to form (at the same time) i) top vias self-aligned to the ends of the metal lines 702 and ii) top vias over an uncut region of the metal lines 702 (and thus away from the ends of the metal lines 702). It is notable that these two types of top vias (i.e., at the ends of the metal lines 702 and/or over an uncut region of the metal lines 702) can be placed along the same metal line 702, or along different metal lines 702.

Figure 17:
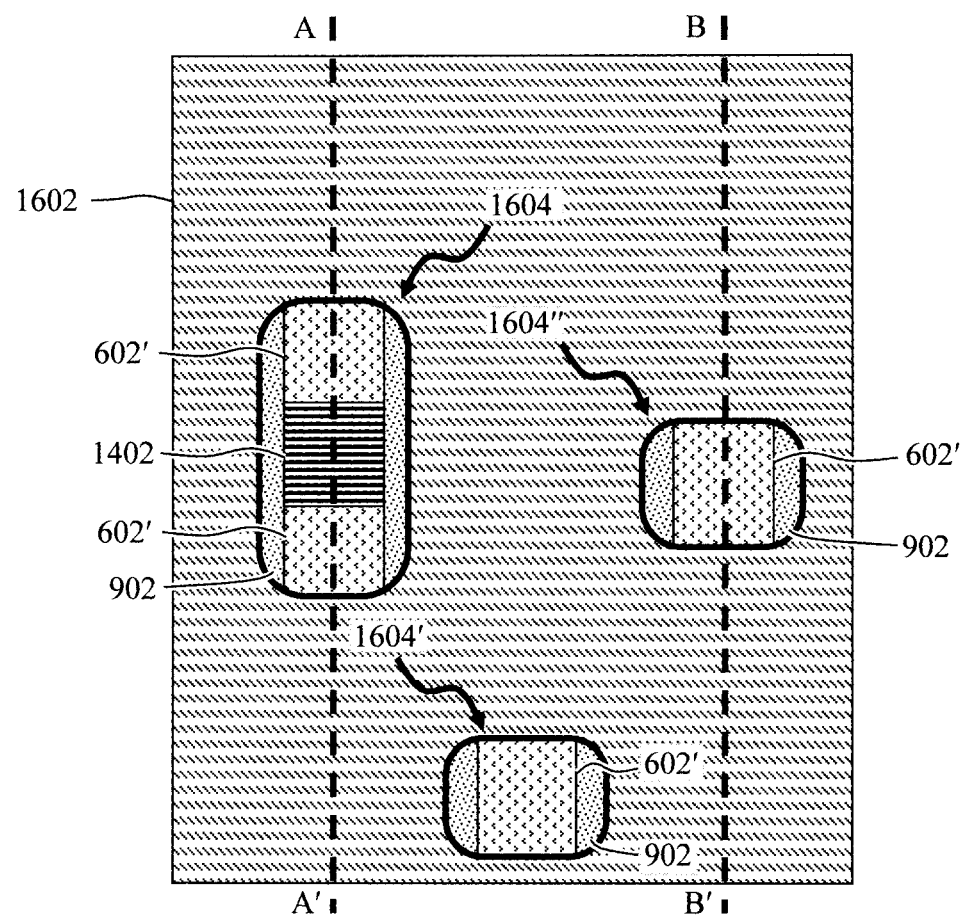
FIG. 17 is a top-down diagram illustrating the second block mask having been formed over the patterned hardmask with the openings marking the locations of top vias according to an embodiment of the present invention.

For instance, referring to FIG. 17 (a top-down view), openings 1604, 1604', and 1604" in the block mask 1602 are shown over the patterned hardmask 602' covering different metal lines 702. As described in conjunction with the description of FIG. 16 above, the opening 1604 in the block mask 1602 is present over the patterned hardmask 602' covering the ends of one of the cut metal lines 702, which are separated by dielectric fill material 1402. As will be described in detail below, two top vias will be formed (one on each end of the cut metal line). On the other hand, the opening 1604' in the block mask 1602 is present over the patterned hardmask 602' covering an uncut one of the metal lines 702. In that case, a (single) top via will be formed along a span (i.e., away from an end) of that metal line 702. The same is true for the opening 1604" in the block mask 1602 over the patterned hardmask 602' covering a span (i.e., away from an end) of another one of the metal lines 702. It is notable, however, that the metal line 702 under opening 1604" in the block mask 1602 was previously cut. See, e.g., FIG. 15 (described above). However, since the opening 1604" is not positioned over the cut, no top vias will be formed at the (cut) ends of that metal line 702.

An etch is then used to transfer the pattern from the block mask 1602 to the underlying patterned hardmask which is now given the reference numeral 602". For illustrative purposes only, a cross-sectional view A-A' as well as a cross-sectional view B-B' (see FIG. 17) are provided in FIG. 18 and FIG. 19, respectively, to depict the process of forming top vias at the (cut) ends and along a span (i.e., away from an end) of the metal lines 702. A directional (anisotropic) etching process such as a RIE can be employed to transfer the pattern from the block mask 1602 to the patterned hardmask 602". Use of a selective RIE will enable etching of the patterned hardmask 602" relative to, among other things, the metal lines 702 and the dielectric fill material 1402. For instance, by way of example only, if a nitride material such as SiN is employed for the dielectric fill material 1402 (see above) and an oxide material such as SiOx is employed for the patterned hardmask 602" (see above), then an oxide-selective etch can be used on the patterned hardmask 602". For illustrative purposes only, suitable oxide-selective etch chemistries include, but are not limited, octaflouro-cyclobutane ($C_4F_8$)/carbon monoxide (CO)/argon (Ar), or hexafluorobutadiene ($C_4F_8$)/Ar. See, for example, U.S. Pat. No. 5,928,967 issued to Radens et al., entitled "Selective Oxide-to-Nitride Etch Process Using $C_4F_8$/CO/AR and Wang et al., "Atomic level control of pattern fidelity during SAC etch," Proceedings Volume 11615, Advanced Etch Technology and Process Integration for Nanopatterning X (February 2021).

Figure 18:
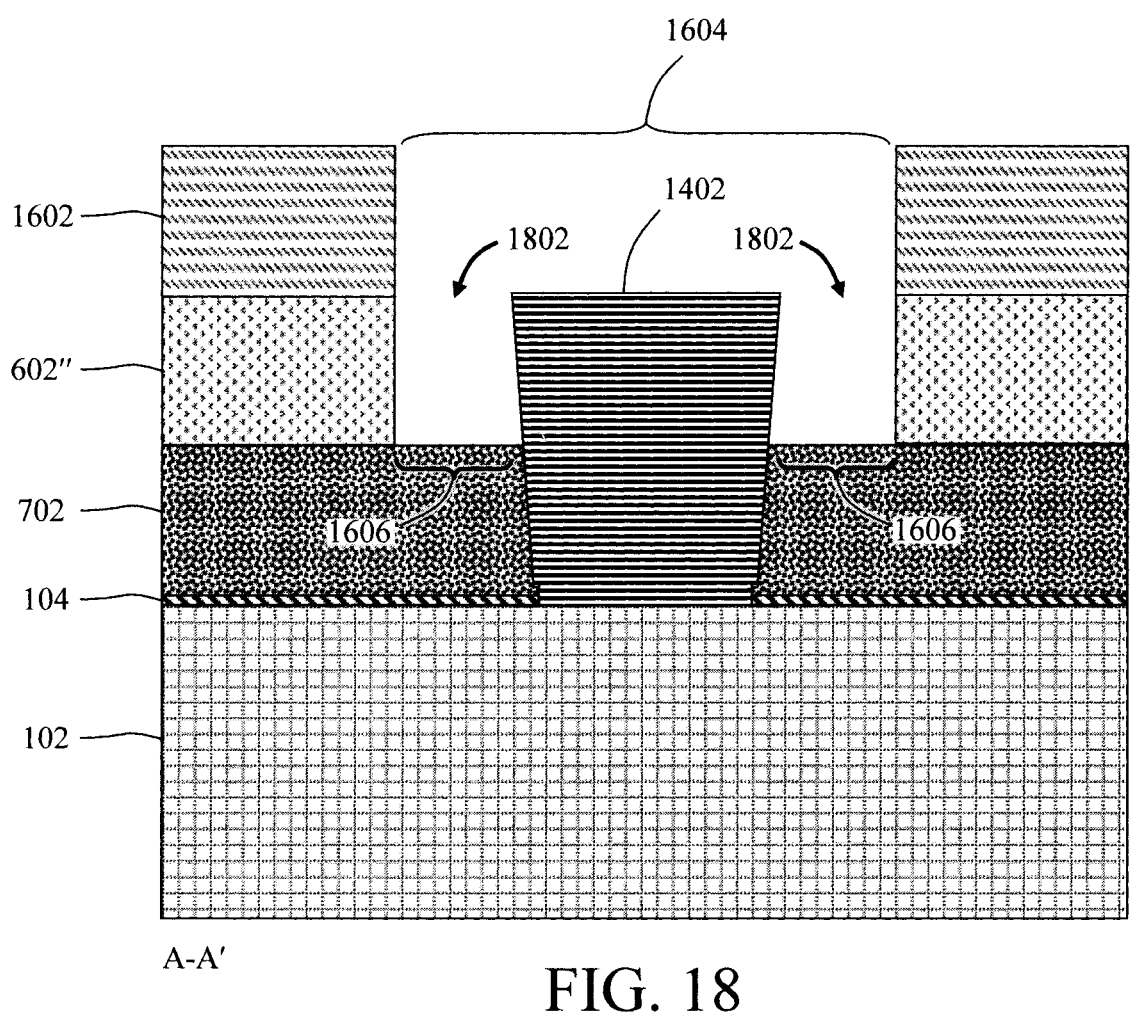
FIG. 18 is a cross-sectional diagram (from view A-A') illustrating the pattern from the second block mask having been transferred to the patterned hardmask which opens cavities in the patterned hardmask on either side of the dielectric fill material over the ends of the underlying metal lines at the cuts according to an embodiment of the present invention.

Namely, referring to FIG. 18 (a cross-sectional view A-A'), this patterning step opens cavities 1802 in the patterned hardmask 602" below opening 1604 in the block mask 1602 on either side of the dielectric fill material 1402 over the ends 1606 of the (cut) metal line(s) 702. It is in these cavities 1802 that top vias will be formed (e.g., using metal fill or selective metal growth) that are self-aligned to the ends 1606 of the (cut) metal line(s) 702. However, as will be described in detail below, a lateral etch will first be used to trim the dielectric fill material 1402, thereby increasing the size of the cavities 1802 and thus the size of the top vias formed therein.

It is notable that, while the positioning of the opening 1604 in the block mask 1602 over the dielectric fill material 1402 is such that cavities 1802 are formed on both sides of the dielectric fill material 1402, the scenario is also contemplated herein where the opening 1604 in the block mask 1602 exposes the patterned hardmask 602" on only one side of the dielectric fill material 1402 (and thus a single cavity 1802 is formed on only one side of the dielectric fill material 1402). In that case, the process is carried out in the same manner as described below, however a top via will be formed on only one cut end of the metal line 702 (that is below the single cavity).

Figure 19:
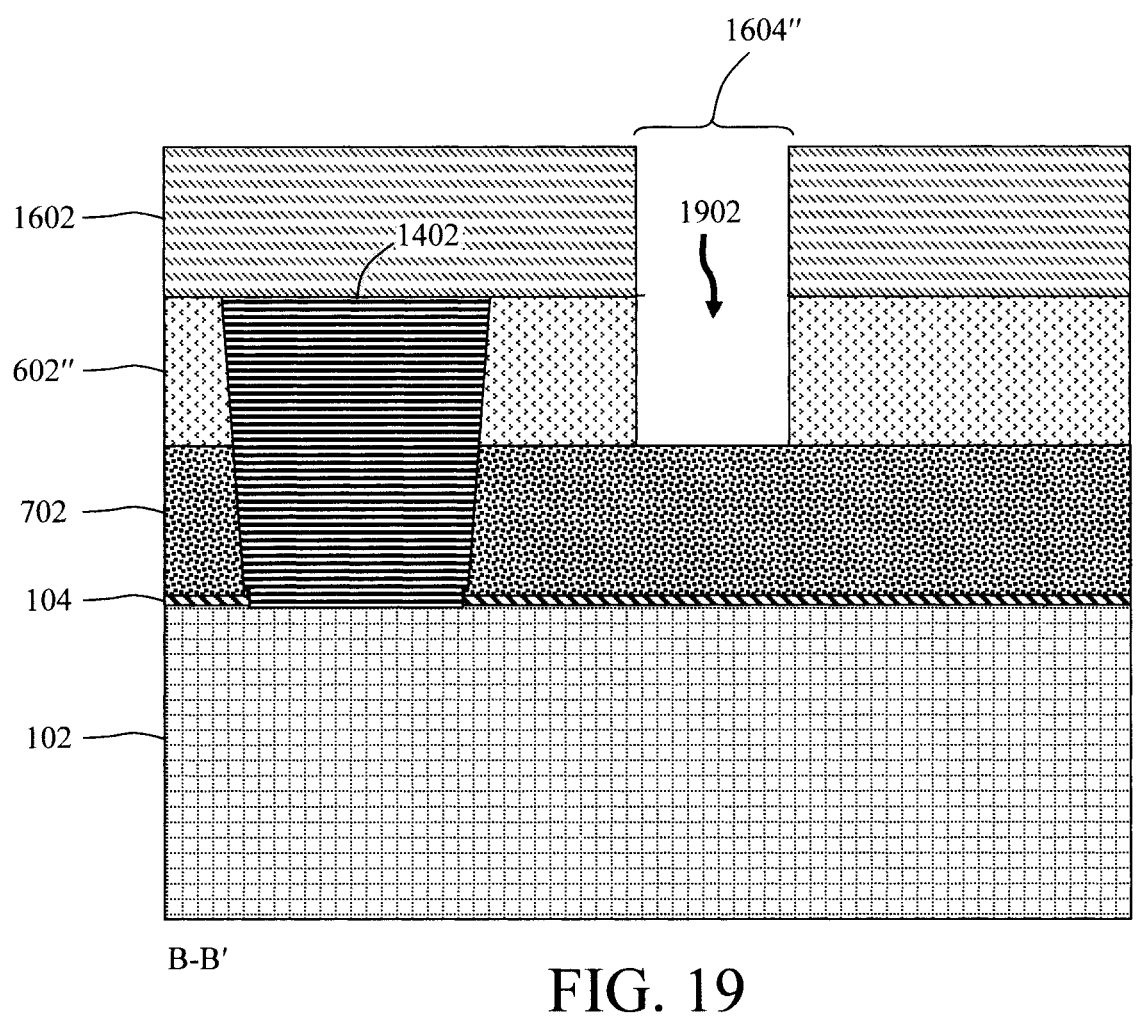
FIG. 19 is a cross-sectional diagram (from view B-B') illustrating the pattern from the second block mask having been transferred to the patterned hardmask which opens a cavity in the patterned hardmask along a span (i.e., away from an end) of the underlying metal line according to an embodiment of the present invention.

Referring to FIG. 19 (a cross-sectional view B-B'), a single cavity 1902 is opened in the patterned hardmask 602" below opening 1604" in the block mask 1602. It is in this cavity 1902 that a top via will be formed along a span (i.e., away from an end) of the underlying metal line 702. Further, it is notable that there is a cut in the metal line 702 shown in FIG. 19. However, the patterned hardmask 602" is not being opened next to the dielectric fill material 1402 in that particular cut. As such, no top vias will be formed over the (cut) ends of the metal line 702 shown in FIG. 19.

Figure 20:
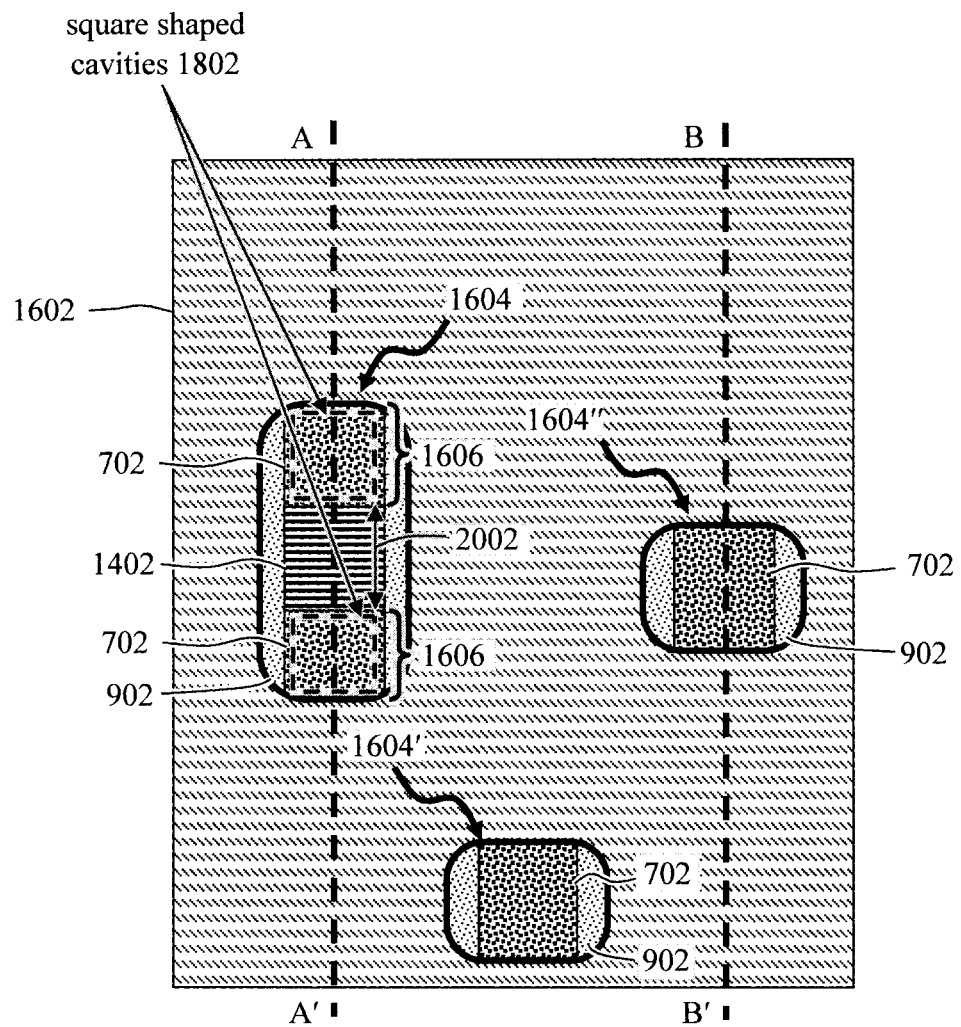
FIG. 20 is a top-down diagram illustrating the pattern from the second block mask having been transferred to the patterned hardmask which opens the cavities in the patterned hardmask according to an embodiment of the present invention.

A top-down view of the structure following the opening of cavities 1802 in the patterned hardmask 602" is shown in FIG. 20. As shown in FIG. 20, the metal lines 702 are now visible in the top-down view due to the opening of the patterned hardmask 602" below openings 1604, 1604' and 1604" in the block mask 1602. Notably, referring to the dielectric fill material 1402 separating the ends 1606 of the metal line 702 that has been cut, it can be seen that the cavities 1802 in which the (line end) top vias will be formed are rectangular in shape. The rectangular shape is lithographically defined by the openings 1102 in the block mask 1002 (see description of FIG. 11, above), the openings 1604, 1604' and 1604" in the block mask 1602, and the selective etch of the patterned hardmask versus ILD 902. The ILD 902 and the ILD 902 plus lithographically-defined hardmask boundary will help to retain a rectangular shape of the cavities 1802 in which the (line end) top vias will be formed. As provided above, conventional approaches involve subtractive patterning to form the top vias. However, this process can cause rounding at the ends of the metal lines. As a result, with conventional approaches the top vias will undesirably have a smaller/reduced size due to the rounded metal line profile which leads to a higher interconnect resistance. Advantageously, with the present techniques this issue of top via rounding or any other type of shape degradation is avoided altogether.

Without the concerns associated with rounding at the ends of the metal lines, the top vias can then be placed (by way of the self-aligned process described below) at the ends of metal lines 702. Doing so advantageously reduces a via-to-via distance 2002 which vastly improves the scaling capacity of the design. See FIG. 20.

A lateral etch trimming of the exposed portions of the dielectric fill material 1402 (i.e., those portions of the dielectric fill material 1402 above the metal lines 702) is then performed to increase the size of the cavities 1802 (and thus the size of the top vias to be formed therein). See FIG. 21 (a cross-sectional view A-A'). According to an exemplary embodiment, this lateral etch trimming of the dielectric fill material 1402 is performed using a selective, non-directional (i.e., isotropic) etching process such as a wet chemical or gas phase etch. For instance, as provided above, the dielectric fill material 1402 can be an oxide material such as AlOx. In that case, an etch using a plasma effluent formed in a plasma from a chlorine-containing precursor and a hydrocarbon can be used to selectively etch the dielectric fill material 1402. See, e.g., U.S. Pat. No. 9,299,583 issued to Wang et al., entitled "Aluminum Oxide Selective Etch."

Figure 21:
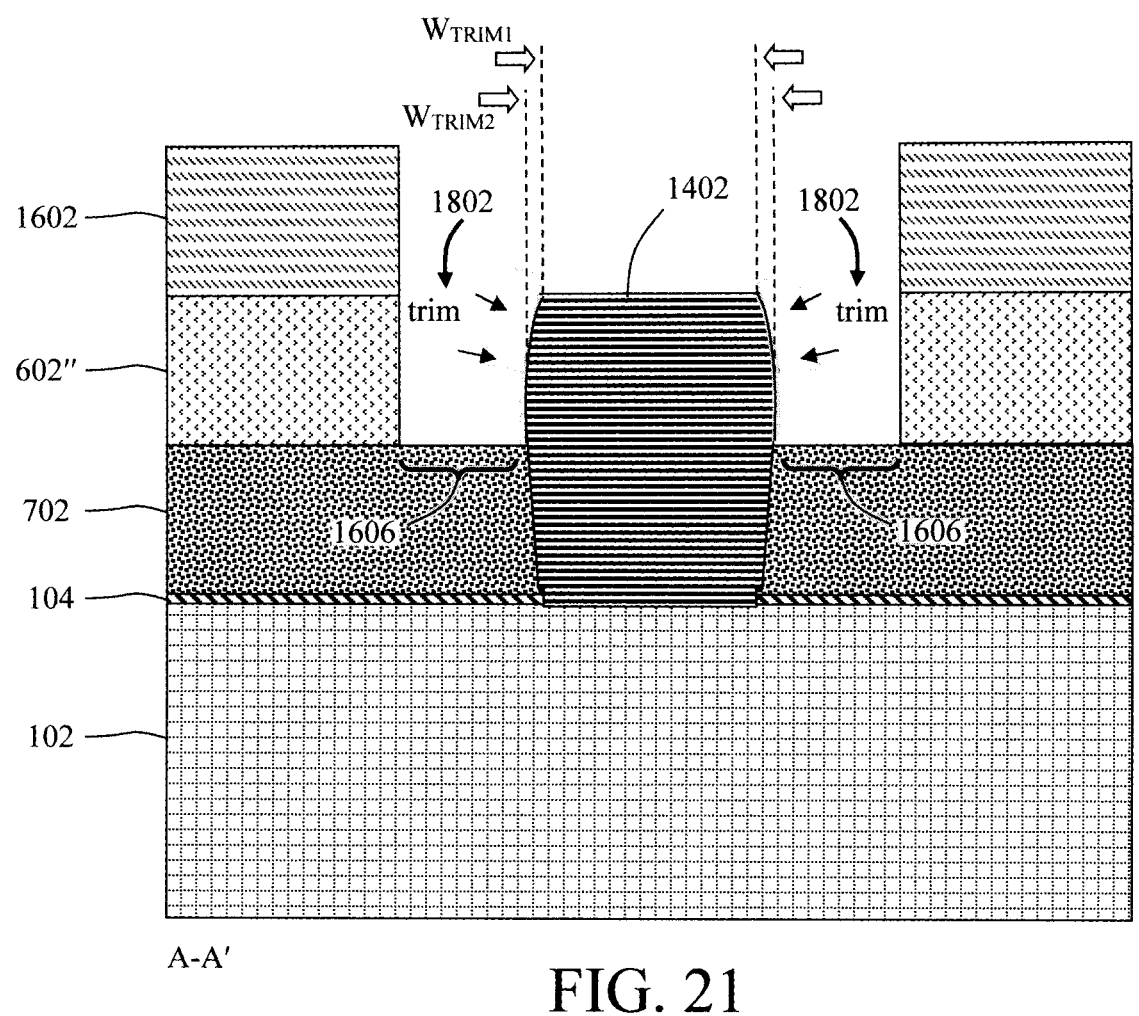
FIG. 21 is a cross-sectional diagram (from view A-A') illustrating a lateral etch trimming of the dielectric fill material having been performed to increase the size of the cavities according to an embodiment of the present invention.

As shown in FIG. 21, this trimming results in a unique shape of the dielectric fill material 1402, which will be imparted to the top vias that will be formed in the cavities 1802. Namely, according to an exemplary embodiment, following the trimming the dielectric fill material 1402 has curved sidewalls whereby a trimmed width $W_{TRIM1}$ at the top of the dielectric fill material 1402 is less than trimmed width $W_{TRIM2}$ at a position between the top of the dielectric fill material 1402 and the corresponding metal line 702, i.e., $W_{TRIM1} < W_{TRIM2}$. See FIG. 21.

By contrast, no trimming will occur in the regions of the design where the dielectric fill material 1402 is present but is not exposed. For instance, referring back briefly to the cross-sectional view B-B' shown in FIG. 19, the dielectric fill material 1402 in that region is protected by the patterned hardmask 602" and block mask 1602, and thus will not be trimmed.

Figure 22:
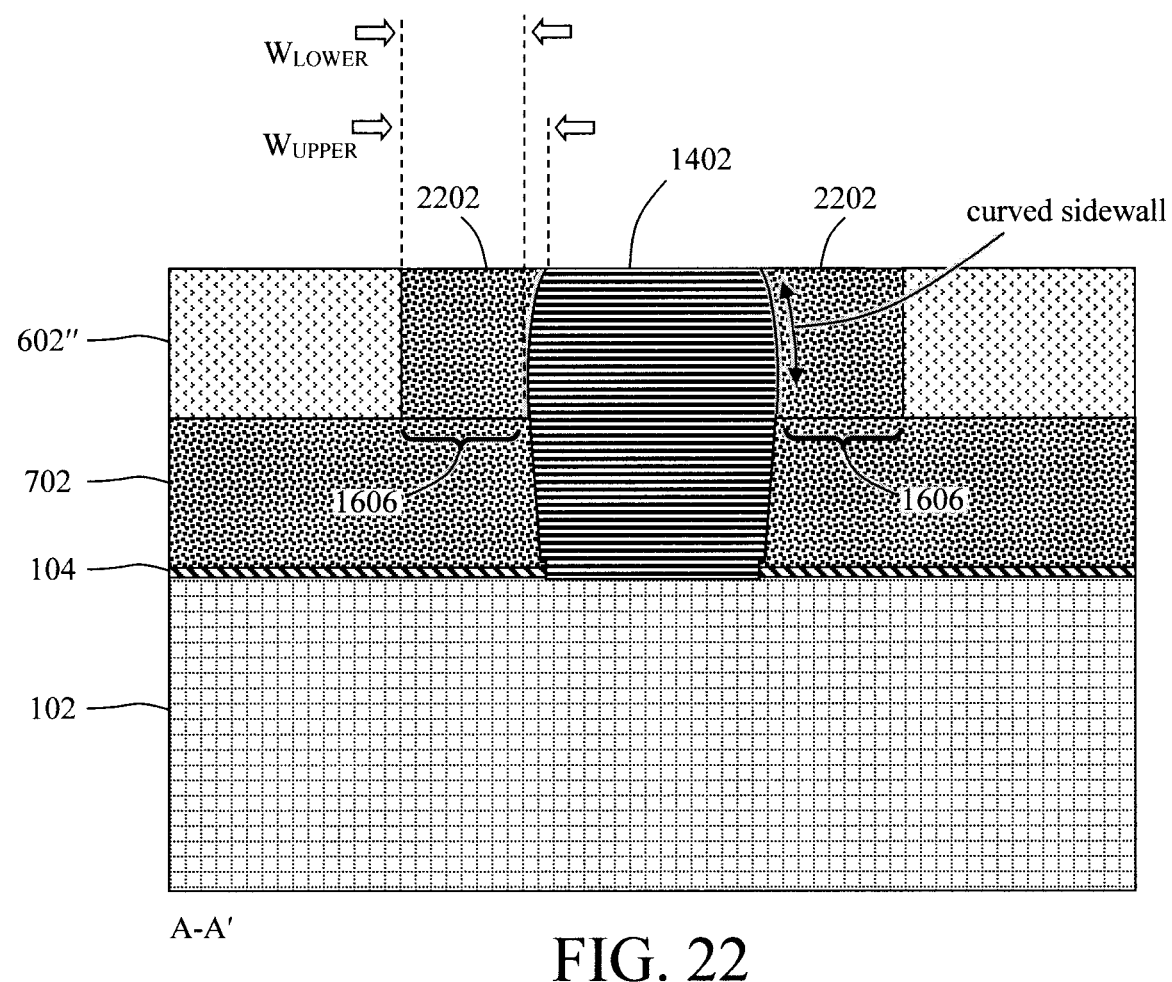
FIG. 22 is a cross-sectional diagram (from view A-A') illustrating the second block mask having been removed and top vias having been formed in the cavities with those top vias over the metal line ends being self-aligned according to an embodiment of the present invention.

Following trimming of the dielectric fill material 1402, the block mask 1602 is then removed. As provided above, the block mask 1602 can be formed from an OPL material. In that case, the block mask 1602 can be removed using a process such as ashing. Top vias 2202 are then formed in the cavities 1802 (i.e., adjacent to the dielectric fill material 1402), 1902, etc. See FIG. 22 (a cross-sectional view A-A'). Advantageously, as shown in FIG. 22, the top vias 2202 formed in the cavities 1802 over the cut metal line(s) 702 are self-aligned to the ends of that metal line(s) 702 at the cut. Namely, based on the above-described process, the (now-trimmed) dielectric fill material 1402 forms one sidewall of the cavities 1802 while the patterned hardmask 602" forms the other sidewall of the cavities 1802. Since the dielectric fill material 1402 is disposed between the ends of the metal line(s) 702 at the cut, then the top vias 2202 formed in the cavities 1802 will automatically be aligned to those ends of the cut metal line(s) 702.

Some different approaches are contemplated herein for forming the top vias 2202 in the cavities 1802, 1902, etc. For instance, in one exemplary embodiment, a metal fill process is employed. With this approach, a metal (or a combination of metals) is deposited into the cavities 1802, 1902, etc. forming the top vias 2202. Suitable metals for the top vias 2202 include, but are not limited to Ru, Co and/or W which can be deposited into the cavities 1802, 1902, etc. using a process such as CVD, ALD, evaporation, sputtering or electrochemical plating. Following deposition, the metal overburden can be removed using a process such as CMP.

In another exemplary embodiment, the top vias 2202 are formed in the cavities 1802, 1902, etc. using selective metal growth techniques. For instance, area-selective ALD techniques can be employed to grow metals such as Ru on metal surfaces relative to dielectric surfaces. See, for example, Vos et al., "Area-Selective Deposition of Ruthenium by Combining Atomic Layer Deposition and Selective Etching," Chem. Mater. 31, pp. 3878-3882 (May 2019). In that case, deposition of the metal(s) for the top vias 2202 would be selective for the surfaces of metal lines 702 exposed at the bottoms of the cavities 1802, 1902, etc., as opposed to the patterned hardmask 602", dielectric fill material 1402, etc. Whichever process is employed, the top vias 2202 that are formed are in direct physical contact with the respective metal lines.

The above-described trimming of the dielectric fill material 1402 provides the cavities 1802 with a unique shape that is imparted to the top vias 2202 formed in those cavities 1802 by present metal fill or selective metal growth-based process. Namely, as shown in FIG. 22, the top vias 2202 over the (cut) ends 1606 of the metal line(s) 702 each have a curved (in this case a concave-shaped) sidewall adjacent to the (trimmed) dielectric fill material 1402. As a result, according to an exemplary embodiment the top vias 2202 over the (cut) ends 1606 of the metal line(s) 702 each have a lower width $W_{LOWER}$ that is less than an upper width $W_{UPPER}$, i.e., $W_{LOWER} < W_{UPPER}$. See FIG. 22.

Figure 23:
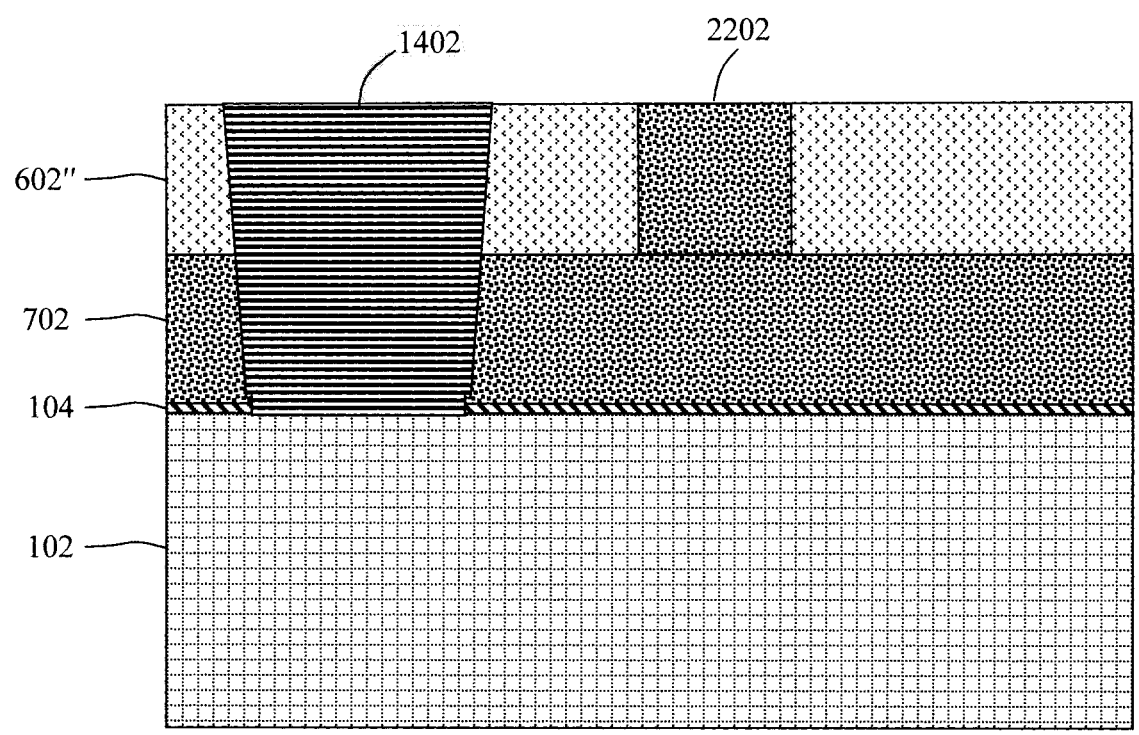
FIG. 23 is a cross-sectional diagram (from view B-B') illustrating one of the top vias that is formed over a span (i.e., away from an end) of one of the metal lines according to an embodiment of the present invention.

FIG. 23 (a cross-sectional view B-B') depicts one of the top vias 2202 that is formed over a span (i.e., away from an end) of one of the metal lines 702. Here, the dielectric fill material 1402 is not present along the sidewall of the cavity 1902. Thus, the shape of the resulting top via 2202 is different from those formed over the (cut) ends 1606 of metal line(s) 702. Namely, by comparison with the top vias 2202 shown in FIG. 22, it can be seen that the top vias 2202 shown in FIG. 23 do not have a curved sidewall. To the contrary, the top vias shown in FIG. 23 have substantially straight, vertical sidewalls. As provided above, the dielectric fill material 1402 in this region of the structure has not been trimmed. Specifically, as shown in FIG. 23, the (untrimmed) dielectric fill material 1402 in this region of the structure has a tapered shape with downward sloping, but straight, sidewalls. Thus, by comparison with the dielectric fill material 1402 that has been trimmed (see FIG. 21 for example), the untrimmed dielectric fill material 1402 shown in FIG. 23 is actually widest at the top. Another unique aspect of this structure is that the top vias 2202 shown in FIG. 23 are separated from the (untrimmed) dielectric fill material 1402 by a portion of the patterned hardmask 602".

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
   at least one metal line disposed on a substrate ;
   at least one top via over the at least one metal line, wherein the at least one top via is aligned with an end of the at least one metal line, and wherein a sidewall of the at least one top via is curved; and
   a dielectric fill material having sidewalls adjacent to the at least one top via that are also curved.

2. The interconnect structure of claim 1, wherein the at least one top via is in direct contact with the at least one metal line.

3. The interconnect structure of claim 1, wherein a lower width WLOWER of the at least one top via is less than an upper width WUPPER of the at least one top via.

4. The interconnect structure of claim 1, wherein the at least one metal line and the at least one top via each comprises a metal selected from the group consisting of: ruthenium (Ru), cobalt (Co), tungsten (W), and combinations thereof.

5. The interconnect structure of claim 1, wherein the dielectric fill material comprises a material selected from the group consisting of: aluminum oxide (ALOx), aluminum nitride (AlNx), titanium oxide (TiO), tantalum oxide (TaO), silicon carbide (SiC), silicon oxycarbide (SiCO), silicon nitride (SiN) and combinations thereof.

6. An interconnect structure, comprising:
   metal lines disposed on a substrate;
   a dielectric fill material in between ends of the metal lines; and
   top vias on the metal lines adjacent to the dielectric fill material, wherein the top vias are aligned with the ends of the metal lines, and wherein sidewalls of the top vias adjacent to the dielectric fill material are curved.

7. The interconnect structure of claim 6, wherein the top vias are in direct contact with the metal lines.

8. The interconnect structure of claim 6, wherein a lower width $W_{LOWER}$ of each of the top vias is less than an upper width $W_{UPPER}$ of each of the top vias.

9. The interconnect structure of claim 6, wherein the metal lines and the top vias comprise a metal selected from the group consisting of: Ru, Co, W, and combinations thereof.

10. The interconnect structure of claim 6, wherein sidewalls of the dielectric fill material adjacent to the top vias are also curved.

11. The interconnect structure of claim 6, wherein the dielectric fill material comprises a material selected from the group consisting of: AlOx, AlNx, TiO, TaO, SiC, SiCO, SiN and combinations thereof.

12. The interconnect structure of claim 6, further comprising:
   at least one other top via on the metal lines away from the ends of the metal lines.

13. The interconnect structure of claim 12, wherein the at least one other top via is separated from the dielectric fill material by a hardmask.

14. A method of fabricating an interconnect structure, the method comprising:
   forming metal lines on a substrate;
   patterning a cut in at least one of the metal lines;
   depositing a dielectric fill material into the cut;
   trimming the dielectric fill material to form a trimmed dielectric fill material with sidewalls that are curved; and
   forming top vias on the metal lines adjacent to the trimmed dielectric fill material, wherein the top vias are aligned with ends of the metal lines at the cut, and wherein sidewalls of the top vias adjacent to the trimmed dielectric fill material are also curved.

15. The method of claim 14, wherein a trimmed width $W_{TRIM1}$ at the top of the trimmed dielectric fill material is less than a trimmed width $W_{TRIM2}$ at a position between the top of the trimmed dielectric fill material and the at least one of the metal lines patterned with the cut.

16. The method of claim 14, further comprising:
   forming a metal layer on the substrate;
   patterning the metal layer into the metal lines using a hardmask;
   patterning the cut in the hardmask; and
   using the hardmask to pattern the cut in the at least one of the metal lines.

17. The method of claim 16, further comprising:
   forming, prior to the trimming of the dielectric fill material, cavities in the hardmask on either side of the dielectric fill material over the ends of the metal lines at the cut; and
   forming, following the trimming of the dielectric fill material, the top vias in the cavities adjacent to the trimmed dielectric fill material.

18. The method of claim 14, wherein the top vias are formed on the metal lines using a metal fill process.

19. The method of claim 14, wherein the top vias are formed on the metal lines using a selective metal growth process.

* * * * *